(12) United States Patent
Xu

(10) Patent No.: US 9,041,438 B2
(45) Date of Patent: May 26, 2015

(54) OUTPUT BUFFER AND SIGNAL PROCESSING METHOD

(71) Applicant: ams AG, Unterpremstätten (AT)

(72) Inventor: Gonggui Xu, Plano, TX (US)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 13/958,446

(22) Filed: Aug. 2, 2013

(65) Prior Publication Data

US 2014/0043090 A1 Feb. 13, 2014

Related U.S. Application Data

(60) Provisional application No. 61/680,387, filed on Aug. 7, 2012.

(30) Foreign Application Priority Data

Aug. 8, 2012 (EP) ..................................... 12179724

(51) Int. Cl.
| | |
|---|---|
| H03B 1/00 | (2006.01) |
| H03K 17/16 | (2006.01) |
| H03K 19/00 | (2006.01) |
| H03K 19/003 | (2006.01) |
| H03K 19/0185 | (2006.01) |

(52) U.S. Cl.
CPC .......... *H03K 17/161* (2013.01); *H03K 19/0016* (2013.01); *H03K 19/00361* (2013.01); *H03K 19/018521* (2013.01)

(58) Field of Classification Search
USPC ............ 327/108–112, 170, 389, 391; 326/26, 326/27, 82, 83
See application file for complete search history.

(56) References Cited

U.S. PATENT DOCUMENTS

| | | | |
|---|---|---|---|
| 4,305,009 A | 12/1981 | Miyagawa et al. | |
| 4,857,863 A | 8/1989 | Ganger et al. | |
| 5,949,259 A * | 9/1999 | Garcia | ........................... 327/111 |
| 6,236,239 B1 | 5/2001 | Kogushi | |
| 6,903,588 B2 | 6/2005 | Vorenkamp | |
| 2010/0244907 A1* | 9/2010 | Gagne et al. | .................. 327/109 |

* cited by examiner

*Primary Examiner* — Long Nguyen
(74) *Attorney, Agent, or Firm* — McDermott Will & Emery LLP

(57) ABSTRACT

An output buffer comprises a series connection of a first field effect transistor and a second field effect transistor, wherein the first field effect transistor is connected to a first supply potential terminal and the second field effect transistor is connected to a second supply potential terminal. An output terminal is connected to a common connection of the first transistor and the second transistor. The output buffer has a series connection of a resistive element and a capacitive element, wherein the capacitive element is connected to the output terminal, and a control circuit, to which an input signal is provided. The control circuit controls the transistors in such a way that turning off of a transistor is performed immediately, while turning on of a transistor is performed depending on the charging or discharging of the capacitive element, thus achieving a defined slew rate of the output signal at the output terminal.

19 Claims, 4 Drawing Sheets

P1: PULL LOW
P2: PULL HIGH PREPARE
P3: PULL HIGH
P4: PULL LOW PREPARE

OUTPUT BUFFER AND SIGNAL PROCESSING METHOD

CROSS-REFERENCE TO RELATED APPLICATIONS

The present application claims the benefit of U.S. Provisional Patent Application Ser. No. 61/680,387, filed on Aug. 7, 2012, and claims priority to European Patent Application No. 12179724.5 filed on Aug. 8, 2012, both disclosures of which are hereby incorporated by reference in their entirety for all purposes.

DESCRIPTION

The invention relates to an output buffer and to a signal processing method.

Output buffers are used in variety of microelectronic chips with output drivers to generate binary output signals with defined signal levels. For example, in mobile applications it is desirable to keep interference between microelectronics at a minimum level. In a typical mobile application, a low noise amplifier of a receiver is used to detect weak signals in a micro-voltage level. Therefore, the receiver is sensitive to other on-board large signal transitions, whose harmonics might fall into the signal band of the low noise amplifier.

It is an objective to provide an improved concept for an output buffer and a signal processing method associated therewith.

This object is achieved with the subject-matter of the independent claims. Embodiments and developments of the concept are subject-matter of the dependent claims.

The improved concept is based on the idea of using a series connection of a first and a second field effect transistor, which are connected between a first and a second supply potential terminal and to operate the field effect transistors with a specific timing which effects that an output signal at a common connection of the field effect transistors is generated with low current losses. To this end, the first and the second field effect transistors are controlled such that at any time it is assured that both transistors are not in a conducting state at the same time. For example, one of the field effect transistors is only turned on if the other field effect transistor has reached a non-conducting state. Hence, through currents are avoided, resulting in less power loss. The delay for switching on the other transistor is achieved by using an RC series connection coupled between the output terminal and either of the first and the second supply potential terminal, respectively, with the connection point of the RC series connection being connected to the gate terminal of the field effect transistor. This has the further effect that through the charging of the capacitive element of the RC series connection the respective transistor is turned on with a defined slew rate, resulting in a transition of the output signal at the output terminal with a defined slew rate. Hence, sharp transitions between signal states, which might generate harmonics in other circuit parts, are avoided.

According to one embodiment an output buffer therefore comprises a series connection of a first field effect transistor and a second field effect transistor, the first field effect transistor connected to a first supply potential terminal and the second field effect transistor connected to a second supply potential terminal. The output buffer further comprises an output terminal connected to a common connection of the first field effect transistor and the second field effect transistor, and a series connection of a resistive element and a capacitive element, wherein the capacitive element is connected to the output terminal. Additionally, the output buffer comprises a control circuit.

For example, the control circuit controls the transistors in such a way that turning off of a transistor is performed immediately, while turning on of a transistor is performed depending on the charging or discharging of the capacitive element, thus achieving a defined slew rate of the output signal at the output terminal.

According to one specific implementation form of this embodiment, the control circuit is configured to receive an input signal, in particular a single input signal, for instance a single voltage signal. The input signal is processed in order to produce a control scheme for controlling the field effect transistors. For example, the control circuit is configured, if the input signal changes from a low state to a high state, to control the first field effect transistor to a non-conducting state. Additionally, if the input signal changes to a high state, and after the first field effect transistor has reached the non-conducting state, the control circuit controls the second field effect transistor to a conducting state and connects the output terminal to the first supply potential terminal via the series connection of the resistive element and the capacitive element. In the opposite transition direction, if the input signal changes from a high state to a low state, the control circuit is configured to control the second field effect transistor to a non-conducting state. Additionally, if the input signal changes to a low state, and after the second field effect transistor has reached the non-conducting state, the control circuit controls the first field effect transistor to a conducting state and connects the output terminal to the second supply potential terminal via the series connection of the resistive element and the capacitive element.

According to this implementation form, it is avoided that both the first and the second field effect transistors are in a conducting state at the same time, thus reducing power loss. Additionally, due to the series connection of the resistive element and the capacitive element, the signal transition of the output signal has a defined slew rate in both transition directions. Preferably, a common connection of the resistive element and the capacitive element is connected to the respective gate terminal of the transistor to be controlled into the conducting state in a switchable fashion.

According to another implementation form, the output buffer comprises a first switch, a second switch, a third switch, a fourth switch, a fifth switch and a sixth switch. The first switch is connected between the first supply potential terminal and a gate terminal of the first field effect transistor. The second switch is connected between the gate terminal of the first field effect transistor and a common connection of the resistive element and the capacitive element. The third switch is connected between the common connection of the resistive element and the capacitive element and a gate terminal of the second field effect transistor. The fourth switch is connected between the gate terminal of the second field effect transistor and the second supply potential terminal. The fifth switch is connected between the first supply potential terminal and the sixth switch, which is further connected to the second supply potential terminal. The resistive element is connected to a common connection of the fifth switch and the sixth switch.

In this implementation form, the control circuit is configured to generate respective switching signals for the switches, based on an input signal, in particular a single input signal, for instance a single voltage signal, provided to the control circuit.

For example, a first terminal of the capacitive element is connected to the output terminal, a second terminal of the capacitive element is connected to a first terminal of the resistive element and a second terminal of the resistive element is connected to the common connection of the fifth switch and the sixth switch.

The switches described above allow the deliberate control of the conducting states of the first and the second field effect transistors, in particular to immediately turn off the respective field effect transistor, i.e. control it into a non-conducting state. A transition time from the non-conducting state to the conducting state is each dependent on the charging rate of the capacitive element, which can be switched between the output terminal and the respective gate terminal of the conducting transistor. Hence a defined slew rate for the output signal transition is achieved.

In the above embodiments, the first field effect transistor may be an n-channel field effect transistor, and the second field effect transistor may be a p-channel field effect transistor. In this case, the first supply potential terminal may be a ground potential terminal, and the second supply potential terminal may be a terminal for providing a supply voltage.

In further embodiments, the output buffer may comprise a further capacitive element connected between the output terminal and the first supply potential terminal. For example, the further capacitive element serves to buffer the output potential.

According to one embodiment, the control circuit is configured, if the input signal changes from a low state to a high state, to control the first field effect transistor to a non-conducting state and to control the second field effect transistor to a conducting state after the first field effect transistor has reached the non-conducting state. For the opposite transition direction, the control circuit is configured if the input signal changes from a high state to a low state, to control the second field effect transistor to a non-conducting state and to control the first field effect transistor to a conducting state after the second field effect transistor has reached the non-conducting state.

For example, the control circuit is further configured, if the input signal changes, respectively has changed, to a high state and after the first field effect transistor has reached the non-conducting state, to connect the output terminal to the first supply potential terminal via the series connection of the resistive element and the capacitive element, and, if the input signal changes to a low state and after the second field effect transistor has reached the non-conducting state, to connect the output terminal to the second supply potential terminal via the series connection of the resistive element and the capacitive element.

The various connections and control actions are performed by respective control of the switches of the output buffer.

To this end, according to one embodiment, the control circuit is configured, if the input signal changes to a high state, to close the first switch and the third switch, to open the second switch and the fourth switch and to keep the fifth switch in an open state and the sixth switch in a closed state. If the input signal changes to a low state, the control circuit is configured to open the first switch and the third switch, the close the second switch and the fourth switch, and to keep the fifth switch in a closed state and the sixth switch in an open state.

The control circuit may further be configured, at a first predetermined period after the input signal changes, respectively has changed, to a high state, to keep the first switch and the third switch in a closed state, to keep the second switch and the fourth switch in an open state, to close the fifth switch and to open the sixth switch. Similarly, the control circuit may be configured, at a second predetermined period after the input signal changes, respectively has changed, to a low state, to keep the first switch and the third switch in an open state, the keep the second switch and the fourth switch in a closed state, to open the fifth switch and to close the sixth switch.

For example, the first predetermined period and the second predetermined period are equal.

According to various embodiments, the element values of the resistive element and the capacitive element are chosen to achieve a desired slew rate in the change of an output signal at the output terminal.

The predetermined periods are provided to assure that the non-conducting state of one field effect transistor is finally achieved before bringing the other field effect transistor to a conducting state.

An embodiment of a signal processing method is to be performed with a circuit arrangement comprising the first field effect transistor and the second field effect transistor connected as described above, the output terminal, the resistive element and the capacitive element as described for the embodiments of the output buffer above. The method comprises receiving an input signal, in particular a single input signal, for instance a single voltage signal, if the input signal changes to a high state, controlling the first field effect transistor to a non-conducting state, if the input signal changes, respectively has changed, to a high state and after the first field effect transistor has reached a non-conducting state, controlling the second field effect transistor to a conducting state and connecting the output terminal to the first supply potential terminal via the series connection of the resistive element and the capacitive element. Additionally, if the input signal changes, respectively has changed, to a low state, the second field effect transistor is controlled to a non-conducting state, and if the input signal changes to a low state and after the second field effect transistor has reached a non-conducting state, the first field effect transistor is controlled to a conducting state and the output terminal is connected to the second supply potential terminal via the series connection of the resistive element and the capacitive element.

Further embodiments of the method become apparent from the various embodiments described for the output buffer above.

The text below explains the invention in detail using exemplary embodiments with references to the drawings. Same references are used for same elements or signals, or elements or signals having a similar function in the various figures. Hence the description of elements or signals in one figure is not repeated in the following figures.

Figure 1:
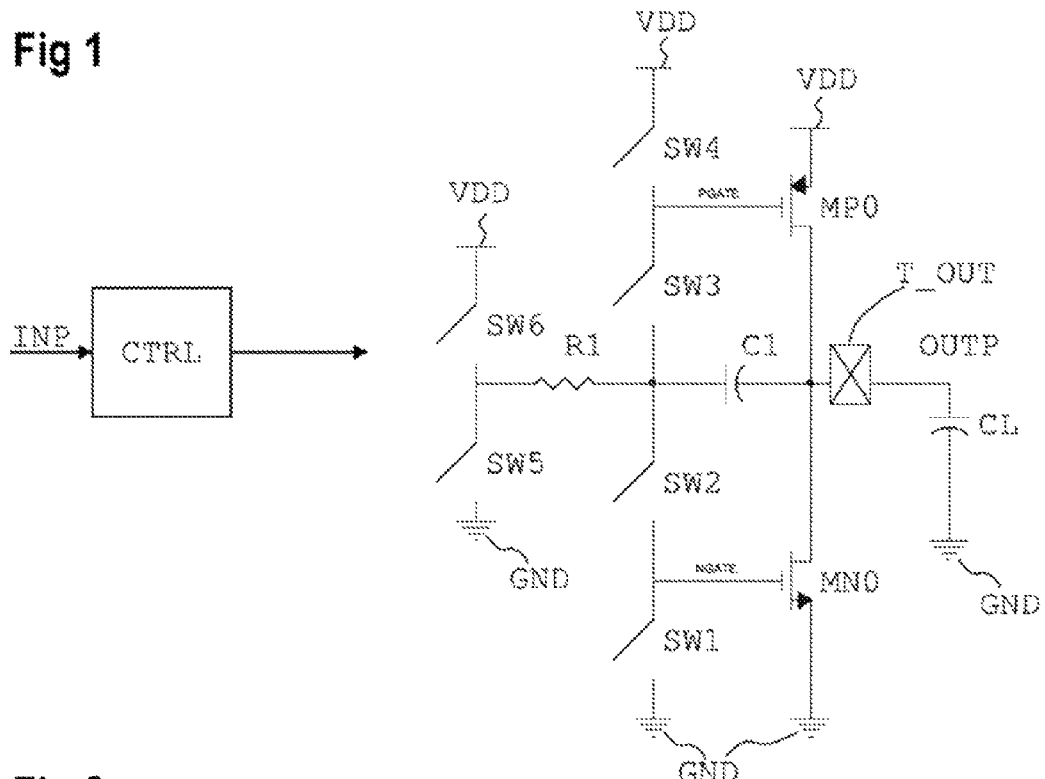
FIG. 1 shows an embodiment of an output buffer.

FIG. 1 shows an embodiment of an output buffer comprising a circuit arrangement with transistors and switches, and a control circuit. The circuit arrangement comprises a series connection of a first field effect transistor MNO, which is an n-channel field effect transistor, and a second field effect transistor MPO being a p-channel field effect transistor. The source terminal of the first field effect transistor MNO is connected to a first supply potential terminal GND, which for example is a ground potential terminal or a reference potential terminal. The source terminal of the second field effect transistor MPO is connected to a second supply potential terminal VDD, which may be a terminal for providing a positive supply voltage. A common connection of the transistors MNO and MPO is connected to an output terminal T_OUT. The circuit arrangement further comprises a first switch SW1 being connected between the first supply potential terminal GND and the gate terminal of the first transistor MNO. A second switch SW2 is connected between the gate terminal of the first transistor MNO and a common connection of an RC series connection of a resistive element R1 and a capacitive element C1. The RC series connection is connected to the output terminal T_OUT at the side of the capacitive element C1. The circuit arrangement comprises a third switch SW3 being connected between the common connection of the RC series connection and the gate terminal of the second transistor MPO. A fourth switch SW4 is arranged between the gate terminal of the second transistor MPO and the second supply potential terminal VDD.

A fifth switch SW5 is connected between the first supply potential terminal GND and the resistive element R1 of the RC series connection. A sixth switch SW6 is connected between the second supply potential terminal VDD and the connection of the resistive element R1 and the fifth switch SW5.

The control circuit CTRL has an input for receiving an input signal INP, in particular a single input signal, for instance a single voltage signal, and an output for providing respective switching signals for the switches SW1 to SW6.

The switches SW1 to SW6 make possible various switching configurations, which for example allow immediately turning off the field effect transistors MNO, MPO separately from each other. This makes it possible to generate a respective output signal OUTP at the output terminal T_OUT based on the input signal INP. The output signal OUTP may be buffered with a further capacitive element CL connected between the output terminal T_OUT and the first supply potential terminal GND. However, the further capacitive element CL may also be omitted from the circuit arrangement of the output buffer.

The control circuit CTRL is configured to generate respective switching signals based on the input signal INP such that a state can be avoided, where both transistors MNO and MPO are in a conducting state, resulting in a through-current between the supply potential terminals VDD, GND. Additionally, the control circuit CTRL is configured to control the switches SW1 to SW6 such that one transistor being in a conducting state does not reach the conducting state immediately but with a defined slew rate, resulting from a charging or discharging process over the capacitive element C1. Hence, the output signal OUTP performs a signal transition with a defined slew rate and thus avoids high frequency harmonics, which may disturb other circuit parts of a circuit, in which the shown output buffer is included.

Figure 2:
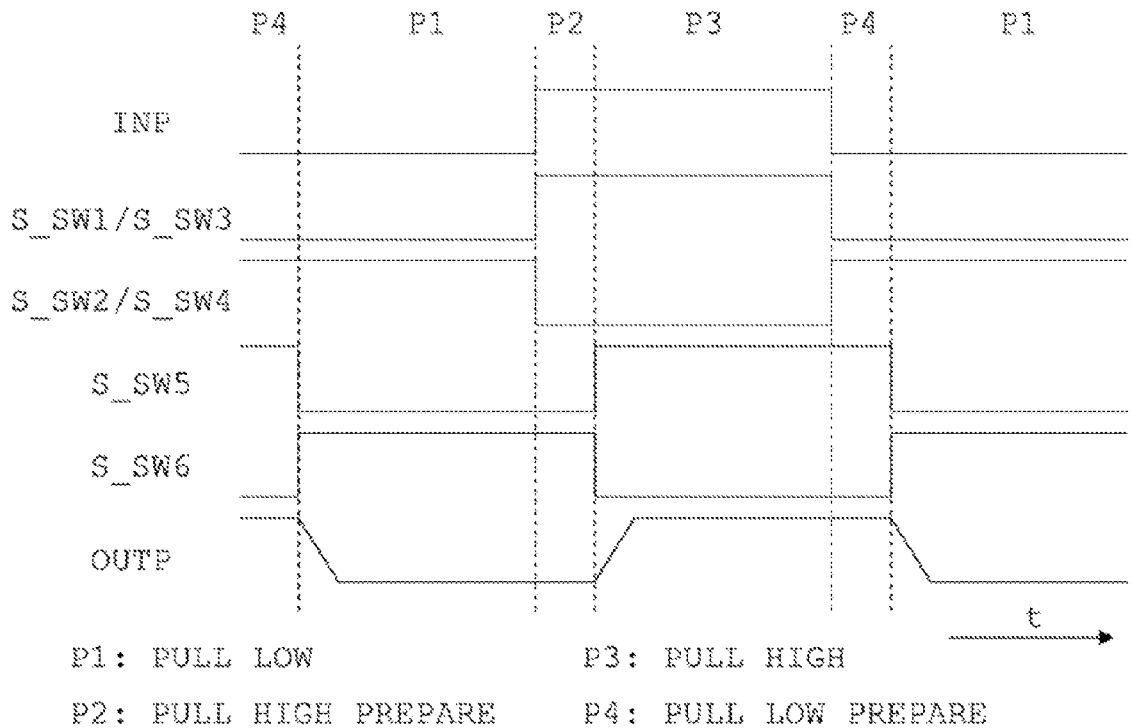
FIG. 2 shows an exemplary signal-time diagram of signals for operating an output buffer according to FIG. 1.

FIG. 2 shows a signal-time diagram of the input signal INP, switching signals S_SW1 to S_SW6, and the output signal OUTP. In particular, the switching signals and the output signal OUTP result from the signal transitions of the input signal INP, which is provided to the control circuit or, respectively, the output buffer, externally. The diagram of FIG. 2 describes four consecutive states, P1, P2, P3, P4, which iteratively follow each other. For example, in the state P1, which is a PULL LOW state, the input signal INP is in a low state such that the output signal OUTP finally should reach the low state, too. The P2 state, which is a PULL HIGH PREPARE state, is initialized by a signal transition of the input signal INP from the low state to a high state. The P2 state is a preparation state for the state P3, which is a PULL HIGH state. The output signal OUTP rises to the high state during the P3 state. The P4 state, which is a PULL LOW PREPARE state, is initialized by a signal transition of the input signal INP from the high state to the low state and acts a preparation state for the following P1 state. The respective switching signals S_SW1 to S_SW6 are derived from the input signal INP, in particular from the signal transitions of the input signal INP. The circuit configurations, in particular the different switching configurations of the circuit arrangement, are described in the following for each state P1 to P4 in conjunction with FIGS. 3 to 6.

Figure 3:
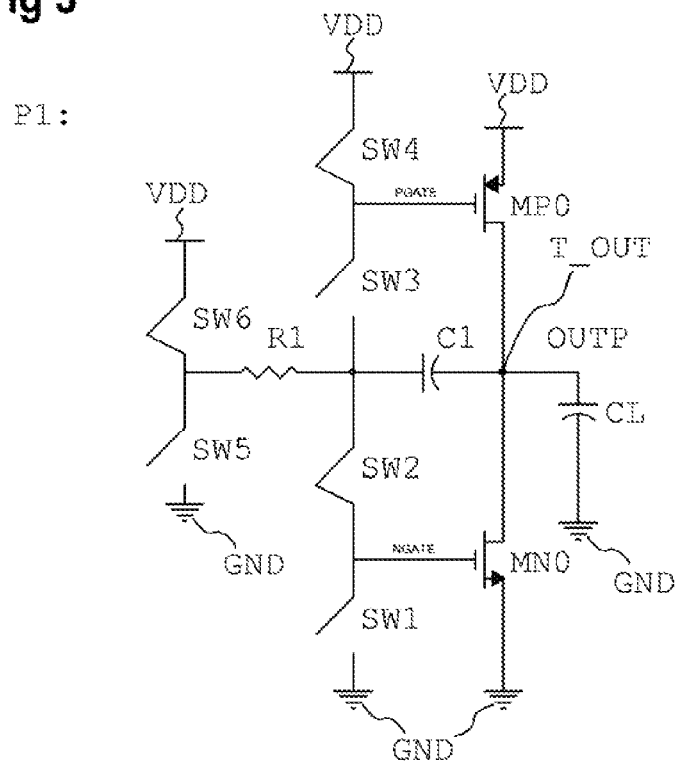
FIG. 3 shows an exemplary switching configuration of a detail of the output buffer of FIG. 1.

FIG. 3 shows the switching configuration of the circuit arrangement of FIG. 1 for the P1, PULL LOW state. With reference to FIG. 2, in the P1 state, the input signal INP has a low state, which is processed by the control circuit CTRL to produce switching signals S_SW1, S_SW3 for switches SW1 and SW3 to be in the low state. Switching signals S_SW2, S_SW4 for switches SW2 and SW4 have the inverse state, namely a high state. Accordingly, switches SW1 and SW3 are in an open state, while switches SW2 and SW4 are in a closed state. Switch SW5 is in an open state due to the low state switching signal S_SW5, and switch SW6 is closed due to switching signal S_SW6 being in a high state.

As the input signal INP is in the low state, also the output signal OUTP is to be brought into the low state. To this end, the switching configuration effects that the first transistor MNO is turned on, while the second transistor MPO is turned off. To prevent a through current from the second supply potential terminal VDD to the first supply potential terminal GND through the transistors MPO, MNO, transistor MPO is turned off in the previous state P4 by the switches SW3, SW4, which will be explained in more detail later with reference to FIG. 6. In the steady state of P1, the first transistor MNO is turned on through resistive element R1, while the capacitive element C1, acting as a Miller capacitor, is wrapped around the gate and drain terminals of the pull down transistor MNO.

With reference to FIG. 2, in particular the output signal OUTP at the beginning of state P1, the time of a transition from the high state to the low state is the time to charge up the capacitive element C1 by the current through resistive element R1. The overall slew time is determined by the element values of the resistive element R1 and the capacitive element C1.

Figure 4:
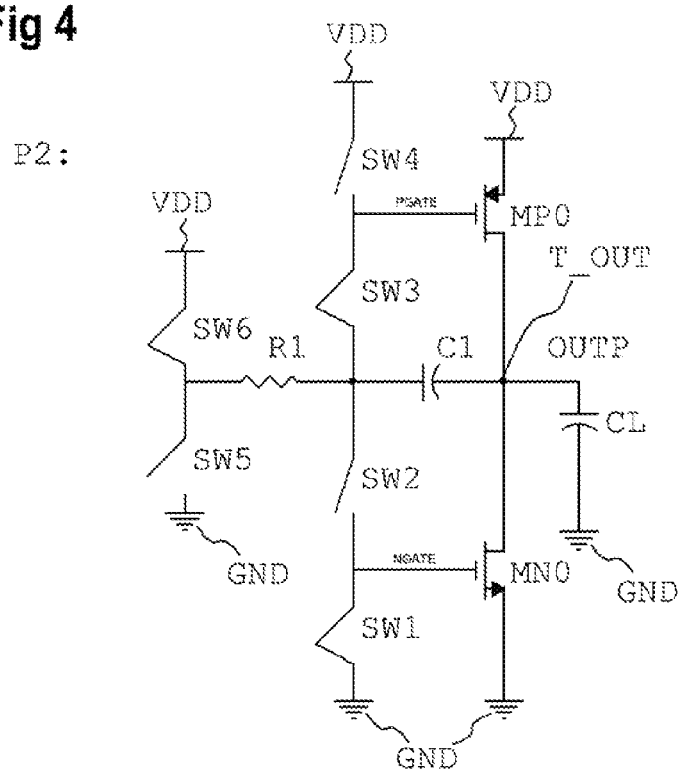
FIG. 4 shows a further exemplary switching configuration of a detail of the output buffer of FIG. 1.

FIG. 4 shows a switching configuration of the circuit arrangement in the state P2, which is the PULL HIGH PREPARE state, during which it is prepared to bring the output signal OUTP from the low state to the high state. The P2 state is initialized by the signal transition of the input signal INP from the low state to the high state. Accordingly, with reference to the diagram of FIG. 2, the states of the switching signals S_SW1, S_SW2, S_SW3 and S_SW4 change, as do the respective switches SW1, SW2, SW3, and SW4. The switching signals S_SW5 and S_SW6 and the switching states of the corresponding switches SW5, SW6 remain unchanged with respect to the previous state P1.

To pull the output signal OUTP into the high state, transistor MPO should be turned on and transistor MNO should be turned off. Therefore, in this state P2, the switching configuration of switches SW1 and SW2 basically immediately turns off the first transistor MNO by providing the ground potential to the gate terminal of transistor MNO. To prepare the transistor MPO for the on state or conducting state, the switch SW4 and the switch SW3 are closed. This switch reconfiguration effectively wraps the capacitive element C1 from transistor MNO to transistor MPO. As, with reference to FIG. 3, the potential at the common connection of switches SW2, SW3 and the capacitive element C1 is charged to the potential at the second supply potential terminal VDD, transistor MPO stays in the non-conducting state during state P2. The capacitive element C1 is not discharged yet.

Figure 5:
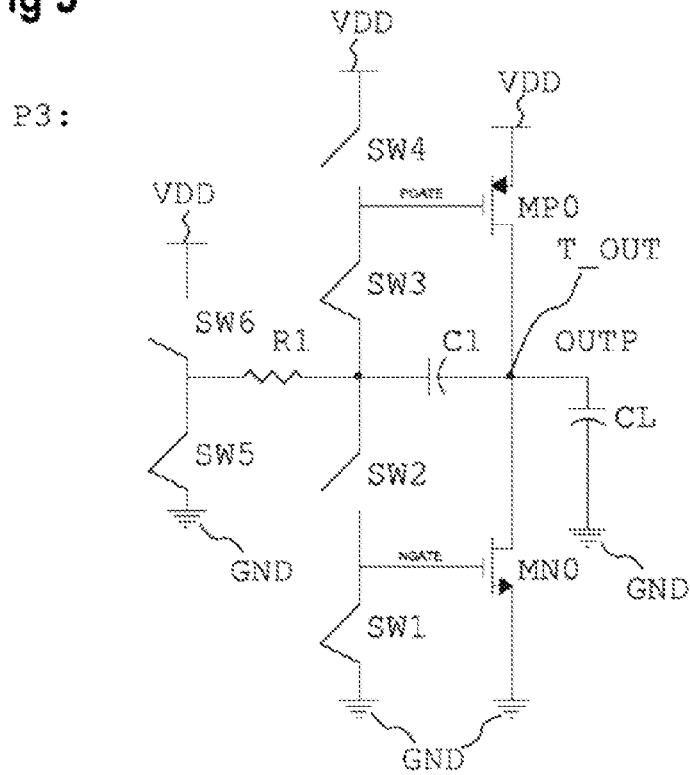
FIG. 5 shows a further exemplary switching configuration of a detail of the output buffer of FIG. 1.

However, going on to FIG. 5, showing the switching configuration for P3, the PULL HIGH state, switching signals S_SW5 and S_SW6 change their state after a predetermined time, for example defined in the control circuit CTRL. Accordingly, switch SW5 is closed and switch SW6 is opened. This effects that the capacitive element C1 is discharged through the resistive element R1 and switch SW5 connecting to the first supply potential terminal GND. Through the discharging, the gate voltage PGATE is pulled low which affects the transistor MPO reaching the conducting state after the time determined by elements R1, C1. This can, for example, be seen in FIG. 2 with the rise of the output signal OUTP at the beginning of state P3. In particular, the time of the transition of the low state to the high state is the time to discharge the capacitive element C1 by the current through resistive element R1. The overall slew time is determined by the element values of elements R1, C1.

Figure 6:
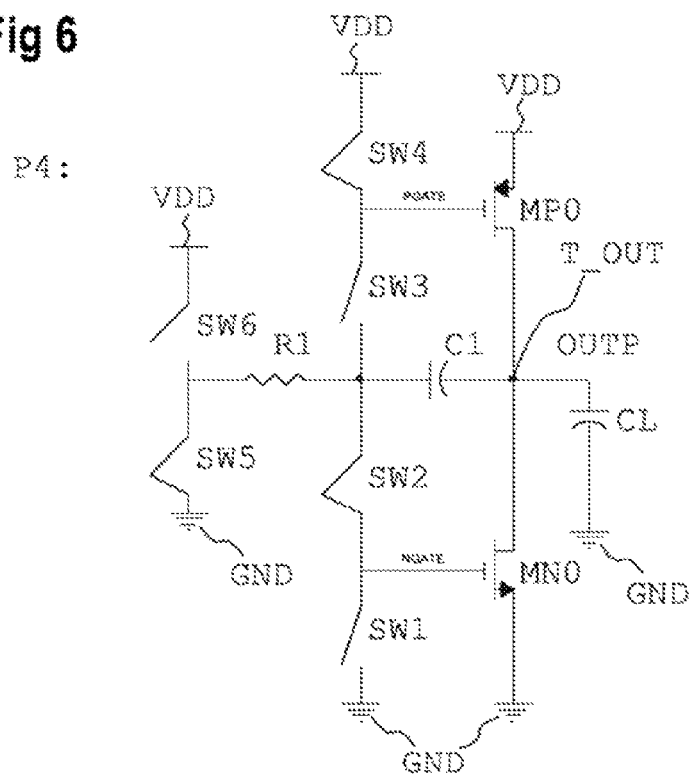
FIG. 6 shows a further exemplary switching configuration of a detail of the output buffer of FIG. 1.

FIG. 6 shows the switching configuration of the circuit arrangement for the P4, PULL LOW PREPARE state, which is a preparation state for the P1 state described in conjunction with FIG. 3. The P4 state is initialized by the signal transition of the input signal INP from the high state to the low state. Accordingly, the output signal OUTP is to be pulled into the low state. To this end, the transistor MNO should be turned on and the transistor MPO should be turned off. Therefore in this state, to turn off the transistor MPO, the switch SW4 is closed and the switch SW3 is opened by respective switching signals S_SW3 and S_SW4, which are shown in FIG. 2. For a preparation of turning transistor MNO on, the switch SW1 is opened and the switch SW2 is closed by respective switching signals S_SW1, S_SW2 shown in FIG. 2. This switch reconfiguration effectively wraps the capacitive element C1, acting as a Miller capacitor, from transistor MPO to transistor MNO.

At the beginning of state P4 or the end of the state P3, respectively, the capacitive element C1 is basically fully discharged. Hence, the n-channel field effect transistor MNO stays in the non-conducting state due to the low potential of the gate voltage NGATE of transistor MNO. Switches SW5 and SW6 are kept in their respective previous positions by leaving the switching signals S_SW5, S_SW6 unchanged. Hence, both transistors MNO and MPO are in a non-conducting state during state P4.

Referring back to FIG. 3 and the state P1, the switching configurations of switches SW5 and SW6 are changed at the beginning of state P1 after a predetermined time, which for example is defined in the control circuit CTRL. Hence, capacitive element C1 is charged through switch SW6 and through current resistive element R1 to the high potential at the second supply potential terminal VDD. Accordingly, the gate voltage NGATE increases and brings the transistor MNO to a conducting state, pulling low the output signal OUTP at the output terminal T_OUT, as can be seen at the beginning of state P1 in the diagram of FIG. 2. The slew rate of the output signal OUPT is determined by the charging time of the capacitive element C1.

The output buffer described above, in particular in combination with the switching scheme described in conjunction with FIGS. 2 to 6, results in lower power consumption compared to a conventional output buffer, as through currents from the supply potential terminals through the transistors MPO, MNO are avoided. Additionally, irrespective of a slew rate of the input signal INP during a signal transition, a signal transition of the output signal is performed with a defined slew rate that can be set by means of respective element values of elements R1, C1. Thus, higher harmonics during signal transitions can be avoided.

Figure 7:
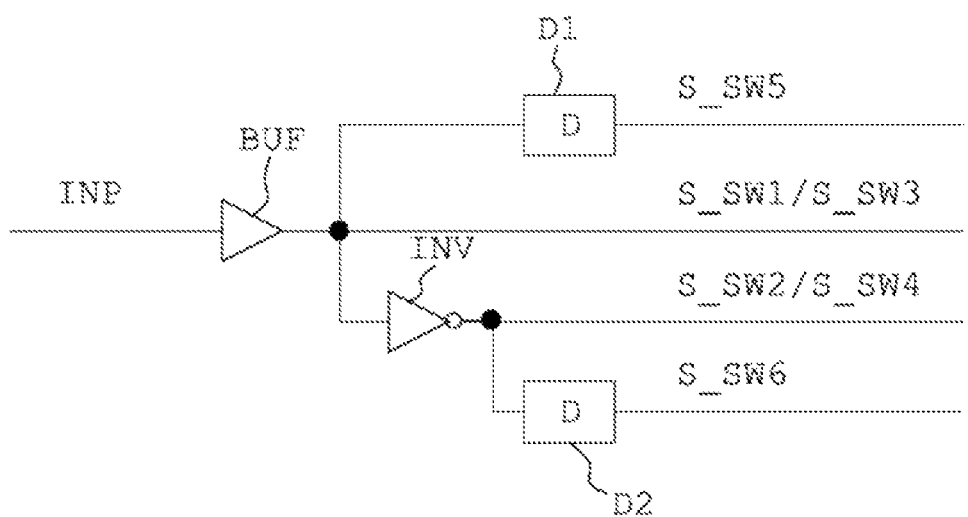
FIG. 7 shows an embodiment of a control circuit.

FIG. 7 shows an exemplary embodiment of a control circuit CTRL to affect a switching scheme such as is shown in the diagram of FIG. 2. The control circuit of FIG. 7 is implemented in hardware. However, it should be noted that this example is not limiting and only serves to demonstrate one example to achieve the desired control behavior. In particular, the switching signals S_SW1 to S_SW6 could be generated by software running under a signal processor, for example.

In the embodiment of FIG. 7, the control circuit CTRL comprises a buffer element BUF, to which the input signal INP is provided. The output signal of the buffer element BUF is used for the switching signals S_SW1 and S_SW3. An inverting element INV arranged downstream of the buffer element BUF serves to generate the switching signals S_SW2 and S_SW4. The switching signal S_SW5, which is a delayed version of the input signal INP or the switching signals S_SW1, S_SW3, respectively, is generated by a first delay element D1, connected to the output of the buffer element BUF. In a similar fashion, switching signal S_SW6, which is a delayed version of switching signals S_SW2 and S_SW4, is generated by a second delay element D2 connected to the output of the inverting element INV. The delay times of the delay elements D1, D2 preferably are equal.

Figure 8:
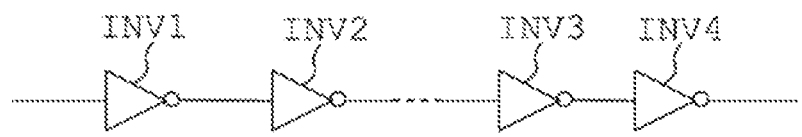
FIG. 8 shows an embodiment of a delay element.

FIG. 8 shows an exemplary embodiment of such a delay element, which may be implemented as a delay line of serially connected inverters INV1, INV2, INV3, and INV4. The delay time may be given by the number of inverting elements, which could be greater than the shown four elements to achieve greater delay times, which is well-known in the art. Furthermore, other well-known delay elements can be used.

In the embodiments described above, in particular the control circuit of FIG. 7, the duration of the P2 and P4 states is defined by the delay times of the delay elements D1, D2. In various embodiments it is also possible to have different durations for the P2 state and the P4 state by providing a slightly different control scheme.

The invention claimed is:
1. An output buffer, comprising:
a series connection of a first field effect transistor and a second field effect transistor, the first field effect transistor connected to a first supply potential terminal and the second field effect transistor connected to a second supply potential terminal;
an output terminal connected to a common connection of the first field effect transistor and the second field effect transistor;
a series connection of a resistive element and a capacitive element, the capacitive element connected to the output terminal;
a first switch connected between the first supply potential terminal and a gate terminal of the first field effect transistor;
a second switch connected between the gate terminal of the first field effect transistor and a common connection of the resistive element and the capacitive element;
a third switch connected between the common connection of the resistive element and the capacitive element and a gate terminal of the second field effect transistor;
a fourth switch connected between the gate terminal of the second field effect transistor and the second supply potential terminal;

a fifth switch connected between the first supply potential terminal and a sixth switch being connected to the second supply potential terminal, wherein the resistive element is connected to a common connection of the fifth switch and the sixth switch; and a control circuit, which is configured to generate respective switching signals for the switches based on a single input signal.

2. The output buffer according to claim 1, wherein a first terminal of the capacitive element is connected to the output terminal, a second terminal of the capacitive element is connected to a first terminal of the resistive element, and a second terminal of the resistive element is connected to the common connection of the fifth switch and the sixth switch.

3. The output buffer according to claim 1, wherein the first field effect transistor is an n-channel field effect transistor, and the second field effect transistor is a p-channel field effect transistor.

4. The output buffer according to claim 1, further comprising:
a further capacitive element connected between the output terminal and the first supply potential terminal.

5. The output buffer according to claim 1, wherein the control circuit is configured,
if the input signal changes to a high state, to control the first field effect transistor to a non-conducting state and to control the second field effect transistor to a conducting state after the first field effect transistor has reached the non-conducting state, and
if the input signal changes to a low state, to control the second field effect transistor to a non-conducting state and to control the first field effect transistor to a conducting state after the second field effect transistor has reached the non-conducting state.

6. The output buffer according to claim 5, wherein the control circuit is configured,
if the input signal changes to a high state and after the first field effect transistor has reached the non-conducting state, to connect the output terminal to the first supply potential terminal via the series connection of the resistive element and the capacitive element, and
if the input signal changes to a low state and after the second field effect transistor has reached the non-conducting state, to connect the output terminal to the second supply potential terminal via the series connection of the resistive element and the capacitive element.

7. The output buffer according to claim 1, wherein the control circuit is configured,
if the input signal changes to a high state, to close the first switch and the third switch, to open the second switch and the fourth switch, and to keep the fifth switch in an open state and the sixth switch in a closed state, and
if the input signal changes to a low state, to open the first switch and the third switch, to close the second switch and the fourth switch, and to keep the fifth switch in a closed state and the sixth switch in an open state.

8. The output buffer according to claim 7, wherein the control circuit is configured,
at a first predetermined period after the input signal changes to a high state, to keep the first switch and the third switch in a closed state, to keep the second switch and the fourth switch in an open state, to close the fifth switch, and to open the sixth switch, and
at a second predetermined period after the input signal changes to a low state, to keep the first switch and the third switch in an open state, to keep the second switch and the fourth switch in a closed state, to open the fifth switch, and to close the sixth switch.

9. The output buffer according to claim 8, wherein the first predetermined period and the second predetermined period are equal.

10. The output buffer according to claim 1, wherein element values of the resistive element and the capacitive element are chosen to achieve a desired slew rate in the change of an output signal at the output terminal.

11. The output buffer according to claim 1, wherein the single input signal is a single voltage signal.

12. An output buffer, comprising:
a series connection of a first field effect transistor and a second field effect transistor, the first field effect transistor connected to a first supply potential terminal and the second field effect transistor connected to a second supply potential terminal;
an output terminal connected to a common connection of the first field effect transistor and the second field effect transistor;
a series connection of a resistor and a capacitor, the capacitor connected to the output terminal; and
a control circuit, which is configured:
to receive a single input signal;
if the input signal changes to a high state, to control the first field effect transistor to a non-conducting state;
if the input signal has changed to a high state and after the first field effect transistor has reached the non-conducting state, to control the second field effect transistor to a conducting state and to connect the output terminal to the first supply potential terminal via the series connection of the resistor and the capacitor;
if the input signal changes to a low state, to control the second field effect transistor to a non-conducting state; and
if the input signal has changed to a low state and after the second field effect transistor has reached the non-conducting state, to control the first field effect transistor to a conducting state and to connect the output terminal to the second supply potential terminal via the series connection of the resistor and the capacitor,
wherein a fixed resistance value of the resistor and a capacitance value of the capacitor are chosen to achieve a desired slew rate in the change of an output signal at the output terminal.

13. The output buffer according to claim 12, wherein
connecting the output terminal to the first supply potential terminal is performed by the control circuit at a first predetermined period after the input signal changes to a high state, and
connecting the output terminal to the second supply potential terminal is performed by the control circuit at a second predetermined period after the input signal changes to a low state.

14. The output buffer according to claim 13, wherein the first predetermined period and the second predetermined period are equal.

15. The output buffer according to claim 12, wherein the single input signal is a single voltage signal.

16. A signal processing method with a circuit arrangement, wherein the circuit arrangement comprises a series connection of a first field effect transistor and a second field effect transistor, the first field effect transistor connected to a first supply potential terminal and the second field effect transistor connected to a second supply potential terminal, an output terminal connected to a common connection of the first field effect transistor and the second field effect transistor, and a series connection of a resistor and a capacitor, the capacitor connected to the output terminal, the method comprising:

receiving a single input signal;

if the input signal changes to a high state, controlling the first field effect transistor to a non-conducting state;

if the input signal has changed to a high state and after the first field effect transistor has reached the non-conducting state, controlling the second field effect transistor to a conducting state and connecting the output terminal to the first supply potential terminal via the series connection of the resistor and the capacitor;

if the input signal changes to a low state, controlling the second field effect transistor to a non-conducting state; and if the input signal has changed to a low state and after the second field effect transistor has reached the non-conducting state, controlling the first field effect transistor to a conducting state and connecting the output terminal to the second supply potential terminal via the series connection of the resistor and the capacitor, wherein a fixed resistance value of the resistor and a capacitance value of the capacitor are chosen to achieve a desired slew rate in the change of an output signal at the output terminal.

17. The method according to claim 16, wherein connecting the output terminal to the first supply potential terminal is performed at a first predetermined period after the input signal changes to a high state, and connecting the output terminal to the second supply potential terminal is performed at a second predetermined period after the input signal changes to a low state.

18. The method according to claim 17, wherein the first predetermined period and the second predetermined period are equal.

19. The method according to claim 16, wherein the single input signal is a single voltage signal.

* * * * *